United States Patent [19]

Schrenk

[11] Patent Number: 5,497,462
[45] Date of Patent: Mar. 5, 1996

[54] METHOD AND CIRCUIT FOR PROTECTING CIRCUIT CONFIGURATIONS HAVING AN ELECTRICALLY PROGRAMMABLE NON-VOLATILE MEMORY

[75] Inventor: Hartmut Schrenk, Haar, Germany

[73] Assignee: Siemens Aktiengesellschaft, Munich, Germany

[21] Appl. No.: 276,166

[22] Filed: Jul. 15, 1994

Related U.S. Application Data

[63] Continuation-in-part of Ser. No. 42,835, Apr. 5, 1993, abandoned, which is a continuation of Ser. No. 381,130, Jul. 14, 1989, abandoned.

[30] Foreign Application Priority Data

Jul. 20, 1988 [DE] Germany ............................ 38 24 674.0

[51] Int. Cl.⁶ .................................................. G06F 11/00
[52] U.S. Cl. ...................................... 395/188.01; 365/201
[58] Field of Search ........................ 395/575; 365/189.09, 365/201

[56] References Cited

U.S. PATENT DOCUMENTS

| | | |
|---|---|---|
| 4,279,024 | 7/1981 | Schrenk . |
| 4,460,982 | 7/1984 | Gee et al. . |
| 4,755,815 | 7/1988 | Savoyet et al. . |

FOREIGN PATENT DOCUMENTS

| | | |
|---|---|---|
| 0207320 | 7/1985 | European Pat. Off. . |
| 0214390 | 3/1987 | European Pat. Off. . |
| 0224639 | 6/1987 | European Pat. Off. . |
| 0127809 | 8/1988 | European Pat. Off. . |
| 0128362 | 11/1988 | European Pat. Off. . |
| 3315047 | 10/1984 | Germany . |
| 2621269 | 5/1985 | Germany . |
| 8606205 | 10/1986 | WIPO . |

*Primary Examiner*—Vincent P. Canney
*Attorney, Agent, or Firm*—Herbert L. Lerner; Laurence A. Greenberg

[57] ABSTRACT

In a method and circuit for protecting circuit configurations having an electrically programmable non-volatile memory used as a non-volatile counter, an access check is provided in the circuit configuration by comparison of a check code to be fed in with a secret code. Each counter bit is evaluated immediately after programming the counter bit. A protected function is disabled in dependence on the recognition of the counter bit as written. The reading level is set during the evaluation of a particular counter bit to be more-critical than in all of the later reading operations of the counter bit.

4 Claims, 3 Drawing Sheets

FIG.3A S (10)
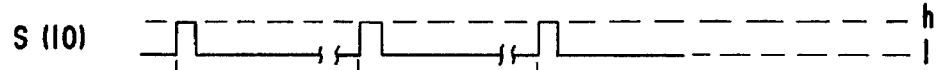
FIG.3B S (QX/6)
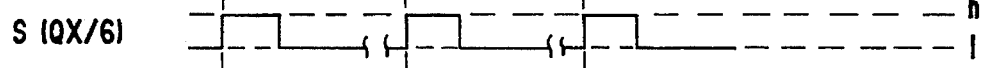
FIG.3C S (QN/6;x)
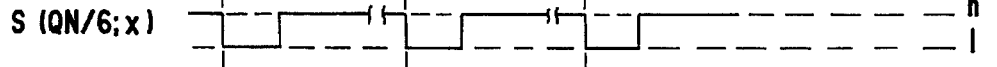
FIG.3D UG
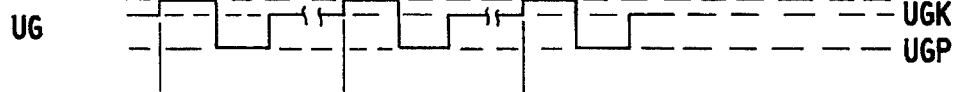
FIG.3E S (QN/5;b)
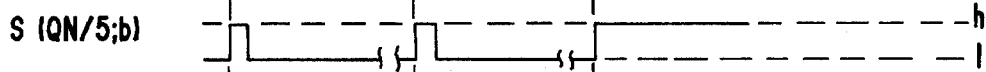
FIG.3F S (a)
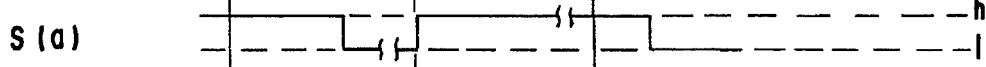
FIG.3G S (11)
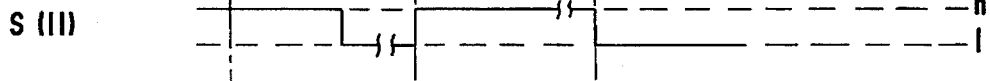
FIG.3H S (9;y)
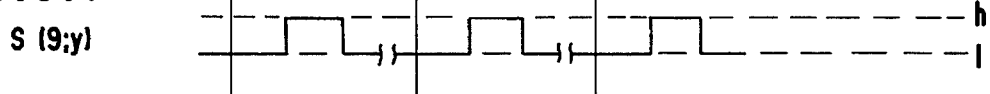
FIG.3I S (S/5)
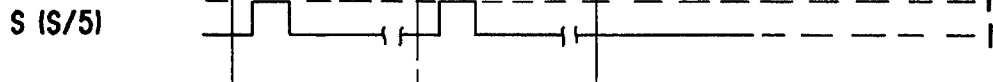
FIG.3J S (7)
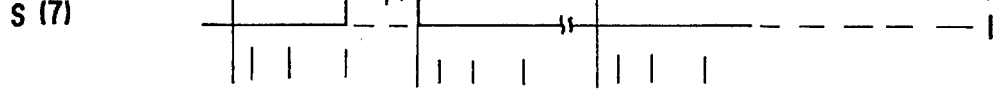

5,497,462

1

METHOD AND CIRCUIT FOR PROTECTING CIRCUIT CONFIGURATIONS HAVING AN ELECTRICALLY PROGRAMMABLE NON-VOLATILE MEMORY

CROSS-REFERENCE TO RELATED APPLICATIONS

This is a continuation-in-part of application Ser. No. 08/042,835, filed Apr. 5, 1993, now abandoned which was a continuation of application Ser. No. 07/381,130, filed Jul. 14, 1989, now abandoned.

BACKGROUND OF THE INVENTION

Field of the Invention

The invention relates to a method and circuit for protecting circuit configurations having an electrically programmable non-volatile or read-only memory that is partly used as a non-volatile counter, against boundary-value, marginal, ambiguous, or non-definite programming of the memory region forming the counter, in which an access check is provided in the circuit configuration by comparison of a check code to be fed in with a secret code stored in the non-volatile memory.

As is well-known, integrated circuits having an electrically programmable non-volatile memory, of the EPROM or EEPROM type, are used on chip cards. As a protection against unauthorized misuse of the chip cards, the chip cards often have a security logic that makes certain user functions such as readout, writing, erasure or comparison of the memory contents dependent on the use of a data comparison, which is internal to the chip, between code data stored in non-volatile fashion in the memory and secret check data, which for instance are to be fed in by a user at a terminal.

In many cases, it is desirable for security reasons to make each use of this secret code detectable, so that even if the secret code is divulged or used in an unauthorized fashion, control over access to the memory is maintained. This makes it possible to detect unauthorized use and to limit the number of unauthorized attempts to use it.

German Patent DE-PS 26 21 269 discloses a data carrier configuration having a data memory, in which the writing-in of data into the data memory or the readout of data from the data memory is enabled only after positive comparison of a code stored in a code data memory of the data carrier configuration with a check code that is to be entered separately, and in which the readout of the code contained in the code data memory to the comparison device is possible, but any change in the code data memory contents is impossible.

German Published, Non-Prosecuted Application DE-OS 33 15 047, corresponding to U.S. Pat. No. 4,680,736, for instance, discloses an integrated circuit in which the erasure of a EEPROM memory range remains non-volatile and always remains detectably stored in a counter that records in non-volatile fashion.

Published European Application No. 0 128 362 discloses a circuit configuration having a memory and a security logic in which the usage authorization must be proved by the input of the check data. These check data are compared in the circuit configuration with code data stored in memory, and the usage authorization is made dependent on the correct data comparison. In order to prevent discovery of the secret code by frequent trial and error, the security logic is constructed in such a way that each attempt is recorded in a memory used in the form of an error counter, the counting range of which limits the number of possible unsuccessful attempts at access. An erasure of the corresponding memory cells, or a resetting of this counter is only possible after a correct input of check data.

In circuits according to German Published, Non-Prosecuted Application DE-OS 33 15 047, corresponding to U.S. Pat. No. 4,680,736, the number of total attempts at access, and in circuits according to Published European Application No. 0 128 362, the number of attempts at access with incorrect control data, are limited by the counter range of a check counter.

In other words, the goal for a defrauder is to manipulate the counter memory in order to attempt to misappropriate the secret code of a circuit configuration of this kind by trial and error. In circuit configurations having a non-volatile data memory in which the memory contents can be decreased, such as smart debit cards, a direct manipulation of the non-volatile data memory of this circuit configuration is attractive to a defrauder.

Such a manipulation can be made by boundary-value programming of bits in a non-volatile memory, in particular a data memory or a counter memory, in such a way that they appear either as "zero" or as "one", as a function of operating parameters such as voltage, temperature, and so forth. Such boundary-value, ambiguous programming is possible in principle by reducing the programming voltage or the programming time.

In the case of boundary-programmed counter bits that can be evaluated as either zero or one, it is possible to circumvent the limitation of the number of attempts at access, which is dictated by the counting range of an enable counter or error counter, such as may be provided in circuits according to German Published, Non-Prosecuted Application DE-OS 33 15 047, corresponding to U.S. Pat. No. 4,680,736 or Published European Application Nos. 0 128 362, 0 127 809, 0 224 639 or 0 214 390.

Especially when using chip cards, if a defrauding user of the card can attain advantages by manipulation of usage units or erasure events, the boundary-value programming represents a weak link in the security chain.

SUMMARY OF THE INVENTION

The possibility of directly influencing a programming event can be limited by controlling program time or program voltage of the integrated circuit containing the applicable circuit configuration. However, such a method is complicated on one hand and still leaves too many possibilities of boundary-value programming of memory bits available on the other hand.

It is accordingly an object of the invention to provide a method for protecting circuit configurations having an electrically programmable non-volatile memory used as a counter from boundary-value ambiguous programming of the memory and a circuit configuration for performing the method, which overcome the hereinafore-mentioned disadvantages of the heretofore-known methods and devices of this general type.

With the foregoing and other objects in view there is provided, in accordance with the invention, a method for protecting circuit configurations having an electrically programmable non-volatile memory used as a non-volatile counter, in which an access check is provided in the circuit configuration by comparison of a check code or check data to be fed in with a secret code, the method which comprises evaluating each counter bit immediately after programming the counter bit, enabling a protected function in dependence on the recognition of the counter bit as written, and setting the reading level during the evaluation of a particular counter bit to be more-critical than in all of the later reading operations of the counter bit.

In accordance with another mode of the invention, there is provided a method which comprises switching between levels for the critical setting of the reading level, by switching from a normal reading level to a critical reading level upon the initiation of the writing operation, and switching back to the normal reading level upon the next bit address change.

With the objects of the invention in view, there is also provided a circuit for protecting circuit configurations having an electrically programmable non-volatile memory used as a non-volatile counter, the circuit comprising a level flipflop, a level switching device connected to the level flipflop, and a logic circuit connected to the level flipflop, the level switching device having an output furnishing an evaluation level set between a normal level and a more-critical level as a function of the switching state of the level flipflop; a control signal for the level flipflop for setting a more-critical evaluation level at the output of the level switching device being provided upon each programming operation of a memory cell to be protected; and the logic circuit having an enable signal output furnishing an enable signal in dependence on the logical state of the selected memory cell.

The method for preventing a boundary-value programming of memory cells of an electrically programmable, non-volatile memory is defined by the fact that after the programming of each memory cell, the contents of this cell are read, and it is only in the event that the corresponding memory cell is recognized as programmed during this reading operation that an enable signal, for instance, enables access to any protected function. Furthermore, according to the invention, in this reading operation provided immediately following the programming operation, the evaluation level is set to be more critical than in the other reading operation. The difference between the typical reading level and the reading level provided immediately after the programming of a bit for the evaluation of this bit should be at least as great as the fluctuation in level attainable by external influences, if possible.

It proves to be advantageous in the presence of a critical reading level, to switch to the normal reading level as a function of the next bit address change.

Other features which are considered as characteristic for the invention are set forth in the appended claims.

Although the invention is illustrated and described herein as embodied in a method for protecting circuit configurations having an electrically programmable non-volatile memory used as a counter from boundary-value ambiguous programming of the memory and a circuit configuration for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagram showing the level behavior at various measuring points for various input signals in a circuit according to FIG. 1.

DESCRIPTION OF THE PREFERRED EMBODIMENT

Figure 1:
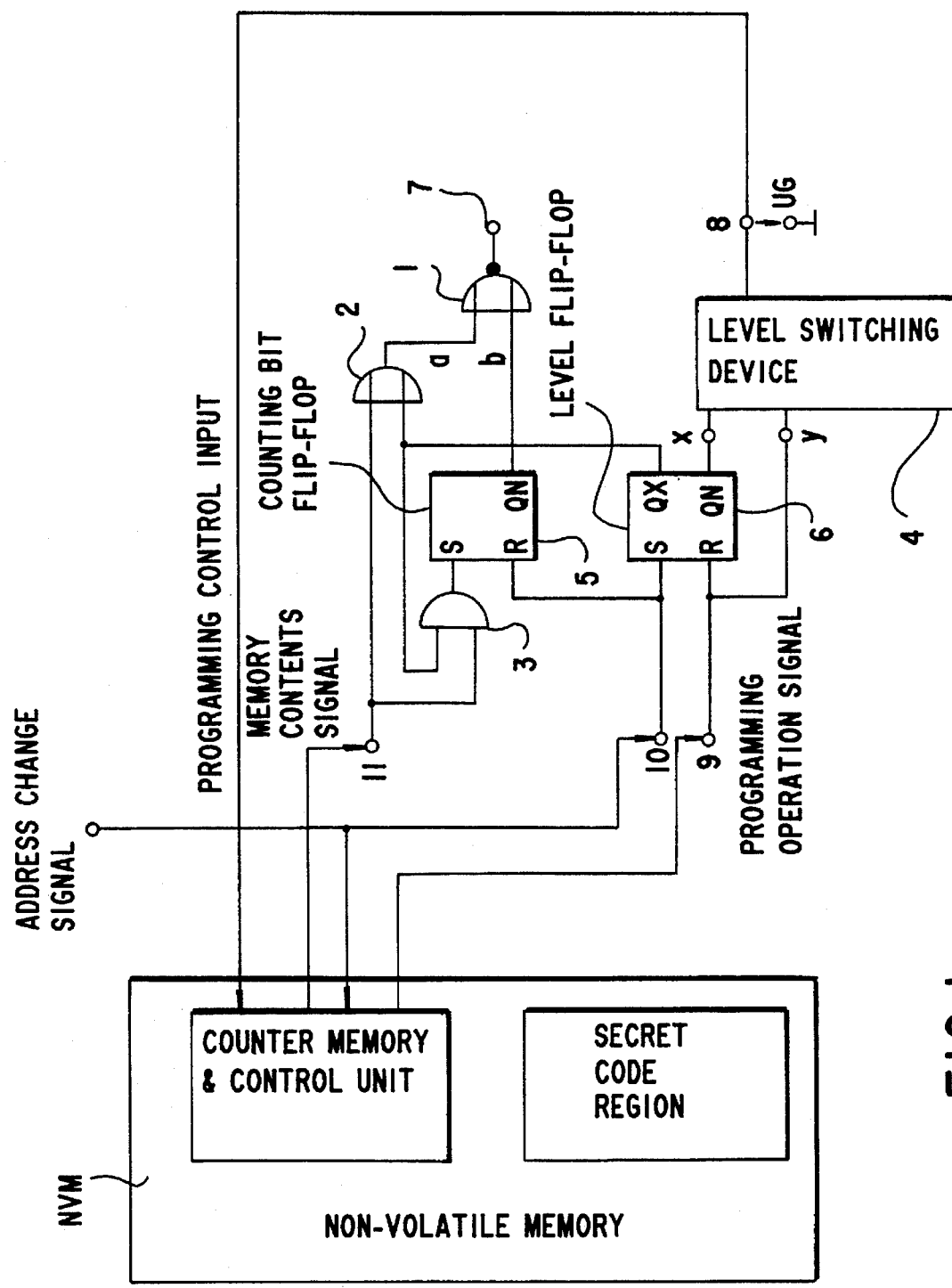
FIG. 1 is a schematic and block circuit diagram according to the invention of a logic circuit with which various evaluation levels can be set or an enable signal can be generated as a function of the memory contents, an address change signal and a signal indicating a programming operation, as well as a level switching device 4.

Referring now to the figures of the drawing in detail and first, particularly, to FIG. 1 thereof, there is seen a logic circuit having a level switching device 4. The logic circuit is formed, among other elements, of a setting gate 1, which in the exemplary embodiment is a NOR gate having an output in the form of an enable signal output 7. A first input "a" of the setting gate 1 is supplied with an output variable of a first OR gate 2, and a second input "b" thereof is connected to an output QN of a counting bit flipflop 5 which carries an inverted output signal. One input of the first OR gate 2 is connected to an input terminal 11, which is acted upon by a signal dependent on the memory contents of the memory cell corresponding to a selected memory address, as well as to one input of a check logic gate 3. The other input of the first OR gate 2 is combined with another input of the aforementioned check logic gate 3 and with an output QX carrying a non-inverted signal of a level flipflop 6. The output signal of the check logic gate 3, which in the exemplary embodiment shown in FIG. 1 is provided as an AND gate, serves to act upon the set input S of the counting bit flipflop 5. A resetting input R of the counting bit flipflop 5 is connected together with a setting input S of the level flipflop 6, to an input terminal 10, which is acted upon by a signal dependent on the address change signal in such a way that each address change leads to the resetting of the counting bit flipflop 5 and the setting of the level flipflop 6. The output QN of the level flipflop 6 that carries the inverted output signal is connected with a first control input "x" of the level switching device 4, by way of which an evaluation level UG present at an output 8 of the level switching device 4 is set to be more critical than in the normal evaluation case. The resetting input R of the level flipflop 6 is connected to an input terminal 9, which is triggered with a signal dependent on a programming operation in such a manner that the level flipflop 6 is reset in a programming operation. In particular, the input terminal 9 can additionally be connected to a second control input "y" of the level switching device 4 as a function of the structure of the level switching device 4, and the voltage level UG at the output 8 of the level switching device 4 is set to the value required for the programming operation by activation of the level switching device 4 through the second control input "y". If the non-volatile memory is formed, for instance, of a EEPROM Flotox cell, then the output 8 of the level switching device 4 is typically connected to the programming line of the memory transistor, and with an activated control input "y", the output 8 is then connected to reference potential.

FIG. 1 further shows a non-volatile memory NVM, for example of the EEPROM type, divided into two regions.

The memory may in principle contain further regions serving further purposes. A first region is a region wherein a secret code is stored. This region can normally be read-out, but not written into. An additional region is constructed as a counter having an associated control unit. This counter receives an externally generated address change signal which is also applied to the input pin 10 of the level flip-flop 6. The control unit of the counter issues a programming signal which is applied to input pin 9 of the level flip-flop 6. Furthermore, the control unit issues a memory-contents signal which is applied to the input pin 11 of the first OR-gate 2. The output pin 8 of the level switching device 4 generates an evaluation level UG, which is applied to the control unit of the counter, so that an evaluation of a programmed counter bit can be performed.

The function of the logic circuit according to the invention as shown in FIG. 1 will now be described for a case in which the non-volatile memory used as the counter is of the EEPROM type.

In an address change in which an address of the aforementioned memory range used as the counter is selected, the counting bit flipflop 5 is reset and the level flipflop 6 is set, both through the input terminal 10.

A LOW signal is then present at the first control input "x" of the level switch 4, and a HIGH signal is present at the second input of the first OR gate 2 and at the input of the check logic gate 3 connected thereto.

Once the selected memory cell has already been programmed, then a LOW signal is present at the input terminal 11, and an enable operation by the setting gate 1 is prevented through the first OR gate 2 and the the check logic gate 3. If the selected memory cell has not yet been programmed, then a HIGH signal is present at the input terminal 11. In this way, the output of the check logic gate, which in this case is an AND gate, is connected to high potential, the counting bit flipflop 5 is set, and thus the second input "b" of the setting gate 1 is applied to low potential and kept there until such time as a new address change is performed.

If the selected memory cell is programmed, then the level flipflop 6 is reset through the input terminal 9. The evaluation level UG is set to be more critical through the high level at the first control input "x" of the level switching device 4. Moreover, the second input of the first OR gate 2 is applied to the low level through the output QX of the flipflop. If a evaluation of the memory contents is performed immediately following the programming operation, or in other words before an address change, then the selected memory cell having the more-critical level is valued as written. In other words, a low level is recognized at the terminal 11, and the first OR gate 2 connects a low signal to the first input "a" of the setting gate 1, and a HIGH signal is present at the enable output 7.

In evaluation with the more-critical level, if the selected memory cell is not recognized as written, then enabling is prevented by the first OR gate 2 and thus by the setting gate 1.

Figure 2:
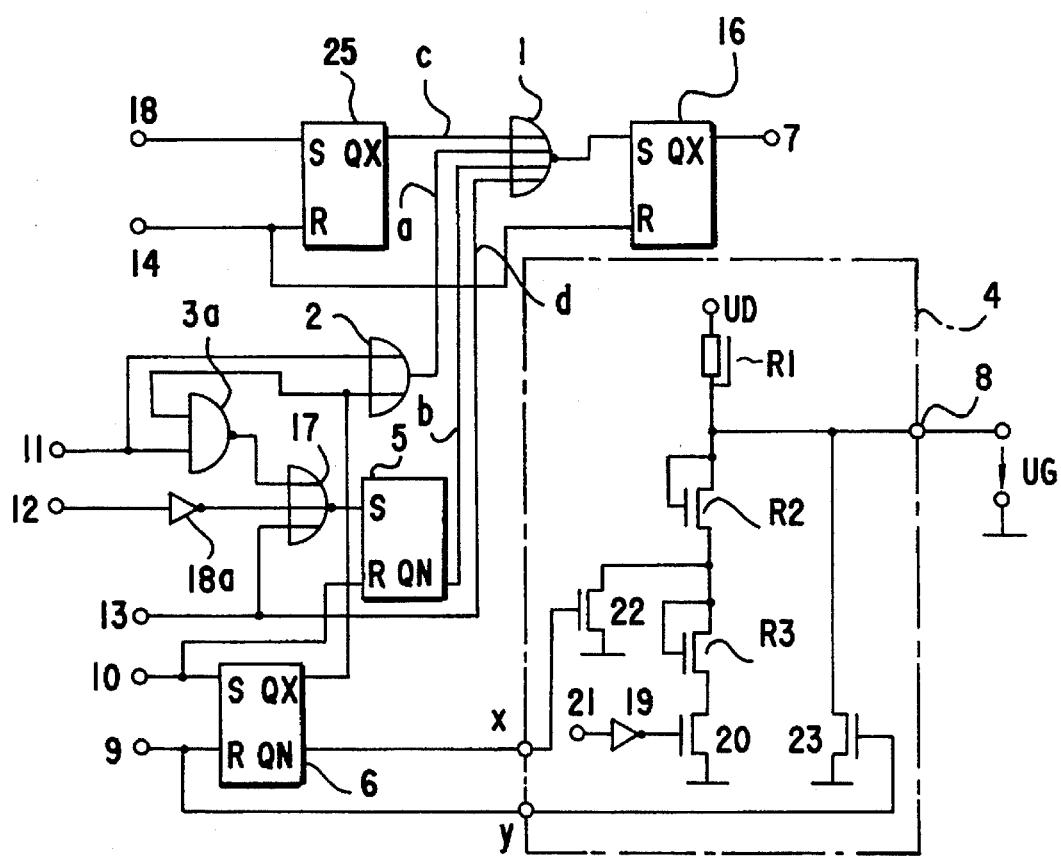
FIG. 2 is a schematic and block circuit diagram of a particularly advantageous exemplary embodiment of a logic circuit as defined by FIG. 1, in which additional input variables affect the enable signal, as well as a possible embodiment of a level switching device 4 for the case in which the electrically programmable non-volatile memory is of the EEPROM type.

In the embodiment shown in FIG. 2, a setting gate 1 having a plurality of inputs is provided. Moreover, an enable flipflop 16 is connected to the output side of the setting gate 1 in a such a way that the output of the setting gate 1 is connected to the setting input S of the enable flipflop 16, an output of the enable flipflop 16 furnishes the enable signal to the enable signal output 7, and the resetting input R of the enable flipflop 16 is connected together with the resetting input R of an error flipflop 25, to a terminal 14 to be acted upon by a resetting signal. One output of the error flipflop 25 is connected to an input "c" of the setting gate 1, and the setting input S of the error flipflop 25 is acted upon through a terminal 18 by a signal in such a way that an erroneous data comparison, for example, a comparison of code data with inaccurate check data, by setting of the error flipflop 25 through the setting gate 1, prevents setting of the enable flipflop 16.

One input "d" of the setting gate 1 is connected to a terminal 13 provided as an enable input. The terminal 13 is acted upon by a setting enable signal, typically a clock signal, which limits the enable signal to the periods of time in which defined levels are to be expected at the memory output. This portion of the circuit and the setting enable signal prevent setting of the enable flipflop 16 during a writing operation because of the undefined level.

The check logic gate 3 provided in the exemplary embodiment of FIG. 1 in the form of an AND gate is provided in the exemplary embodiment of FIG. 2 as a NAND gate 3a. The output of the NAND gate 3a is connected to one input of a further NOR gate 17 and the output of the NOR gate 17 is connected to the setting input S of the counting bit flipflop 5. Another input of the NOR gate 17 is connected to the terminal 13. This makes setting of the counting bit flipflop 5 possible only when a corresponding setting enable signal is present at the terminal 13.

It proves to be particularly advantageous if a further input with which the NOR gate 17 is to be provided is connected to a terminal 12, in particular through an inverter 18a, and if this terminal 12 is triggered with a counter address bit signal in such a way that the counting bit flipflop 5 can be set through the NOR gate 17 only when a counter address to be protected is selected.

One possible embodiment of the level switching device 4 is outlined in phantom in FIG. 2. In this case a supply voltage UD is fed to the output terminal 8 through a first resistor R1, typically a suitably connected depletion-mode field effect transistor. The output terminal 8 is also connectable to the reference potential (ground) through a first switch 23, typically a transistor, which is triggered by a signal applied to the terminal "y", and the output terminal 8 is connected to one connection of a second resistor R2. The other connection of the second resistor R2 is connectable to the reference potential or ground through a second switch 22, typically a transistor, that is triggered by a signal applied to the terminal "x". The other connection of the second resistor R2 is also connected to the reference potential as needed through a third resistor R3 which is connected in series with a third switch 20. The third switch 20 in this case is triggered by an erase signal through a terminal 21, and in particular through an inverter 19. The second and third resistors R2 and R3 are typically provided as suitably connected field effect transistors. In an erase operation, the three switches 20, 22 and 23 are open or in other words the corresponding transistors are blocked, so that almost all of the supply potential UD, for instance 20 volts, is applied to the output terminal 8 as an erase voltage UGL. If a low level is present at the inputs "x" and "y" and the terminal 21, then the switches 22 and 23 are open and the switch 20 is closed. In that case a normal evaluation level UGN, for instance of 2 volts, is present at the output terminal 8, with the quotient of the resistances (R2+ R3) / (R1+ R2+ R3) as a proportionality factor. If a high potential is present at the input "x" and a low potential at the input "y", then the closed switch 22 is parallel to the third resistor R3, making it inoperative. In that case, a more-critical evaluation level UGK of 1.5 volts, for example, is present at the output terminal 8, with the quotient of the resistances R2 / (R1+ R2) as the proportionality factor. If a high potential is present at the input "y", then the output terminal 8 is connected to the reference potential (ground) regardless of the switching state of the switches 20 and 22 through the switch 23, which is equivalent to a programming level UGP of approximately 0 volts.

FIG. 3 is a level diagram, in which the level behavior is shown at ten different measuring points in a circuit according to FIG. 1 for various input signals. In the case of the logic signals, a high level "h" and a low level "l" are respectively indicated, and for the level UG at the output terminal 8, an erase level UGL, a normal evaluation level UGN, a more-critical evaluation level UGK and a programming level UGP are indicated. The signals shown are an address change signal S(10) at the terminal 10, a signal S(QX/6) at the output QX of the level flipflop 6, an inverted output signal S(QN/6;x) of the level flipflop 6, which is also present at the input terminal "x" of the level switching device, the output level UG at the output terminal 8, a level S(QN/5;b) at the output QN carrying the inverted output signal of the counting bit flipflop 5, which is also present at the input "b" of the setting gate, a signal S(a) at the input "a" of the setting gate 1, a signal S(11) at the input terminal 11, which is dependent on the contents of the memory cell selected, a programming signal S(9;y) at the input terminal 9, which is also present at the input terminal "y" of the level switching device 4, a signal S(S/5) present at the setting input S of the counting bit flipflop 5, and a signal S(7) present at the enable signal output 7.

A time range a* in FIG. 3 shows the level courses for the case in which from time t1 to time t2 the address change signal at the input terminal 10 indicates an address change by a high level; in that case the memory cell then selected is recognized as unwritten (i.e. not written into) and a high level therefore appears at the terminal 11; at the terminal 9 from time t3 to time t4, a high level is present because of a programming operation; from time t4 on, the selected memory cell is recognized as written and therefore a low level appears at the terminal 11, which leads to a high level at the enable signal output 7, because a low potential is present from time t4 on, both at the input "a" and at the input "b" of the setting gate 1.

A time range b* in FIG. 3 shows the level courses for the case in which from time ta to time tb the address change signal at the input terminal 10 indicates an address change by a high potential; in that case the memory cell then selected is recognized as unwritten and a high level therefore appears at the terminal 11; at the terminal 9 from time tc to time td, a high level is present because of a programming operation; after the programming, from time t4 on, the selected memory cell, with a more-critically set evaluation level, is not recognized as written into and therefore a potential continues to be present at the terminal 11, as a result of which a high potential continues to be present at the input "a" of the setting gate 1, and the enable signal output 7 remains at the low potential or in other words no enabling takes place.

A time range c* in FIG. 3 shows the level courses for the case in which from time tw to time tx the address change signal at the input terminal 10 indicates an address change by a high level, the selected memory cell at time tw or tx is recognized as written into, and therefore regardless of the ensuing programming operation, a high potential is present at the input "b" of the setting gate 1 and the enable signal output 7 thus remains at the low potential; in other words, no enabling takes place.

The illustration of the level courses in FIG. 3 is purely schematic; only the logical states are shown, and any delays in switching time are not taken into account.

I claim:

1. Circuit for protecting circuit configurations having an electrically programmable non-volatile memory divided into a plurality of memory regions, wherein one of said regions is used as a non-volatile error counter for counting error check data, comprising a level flipflop, a level switching device connected to said level flipflop, and a logic circuit connected to said level flipflop; said level switching device having an output connected to a programming control input of said non-volatile memory, and furnishing an evaluation level set between a normal level and a more-critical level as a function of the switching state of said level flipflop; said level flipflop being connected to an output of said non-volatile memory for preventing unwanted manipulation of said error counter by setting a more-critical evaluation level at said output of said level switching device; said logic circuit furnishing a disable signal in dependence on the logical state of the selected memory cell for disabling the performance of the protected function.

2. Method for protecting a circuit configuration having a non-volatile counter operating as an electrically programmable non-volatile counter, the counter having a normal and a critical reading level, wherein the circuit configuration provides access control by means of a protective function by comparing control data to be entered and compared with a secret code stored in the non-volatile memory, the method which comprises the steps of:

(a) after each comparison, programming a counter bit into the non-volatile counter;

(b) testing, immediately following the programming of a respective counter bit, if the programming has been correctly performed, wherein the testing is performed by reading the respective counter bit with a more critical reading level;

(c) disabling, in case the respective counter bit is determined by the test as being correctly programmed a protective function, or (d) preventing, in case the respective counter bit is determined by the test as not being correctly programmed, disabling of the protective function.

3. Method according to claim 2 performing, in case the respective counter bit is determined by the test as not being correctly programmed, the step of programming a counter bit into the counter.

4. Method according to claim 2, wherein, in step (a) after performing testing by reading the counter bit with a reading level being critical, reverting at the next counter bit address change from the critical reading to the normal reading level.

\* \* \* \* \*